United States Patent
Tanaka et al.

(10) Patent No.: US 6,862,120 B2
(45) Date of Patent: Mar. 1, 2005

(54) HOLOGRAM RECORDING MEDIUM, HOLOGRAM RECORDING METHOD AND HOLOGRAM RECORDING AND REPRODUCING APPARATUS

(75) Inventors: Satoru Tanaka, Tsurugashima (JP); Hajime Matsushita, Tsurugashima (JP); Yoshihisa Itoh, Tsurugashima (JP); Tomomitsu Kouno, Tsurugashima (JP); Hideki Hatano, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/098,616

(22) Filed: Mar. 18, 2002

(65) Prior Publication Data

US 2002/0145773 A1 Oct. 10, 2002

(30) Foreign Application Priority Data

Mar. 22, 2001 (JP) .................................... 2001-082901
Apr. 9, 2001 (JP) .................................... 2001-109534

(51) Int. Cl.[7] ............................................. G03H 1/02
(52) U.S. Cl. .................. 359/7; 359/3; 359/10; 359/11; 359/32; 359/33; 359/35

(58) Field of Search .............................. 354/3, 7, 10, 11, 354/32, 33, 35; 430/1, 2

(56) References Cited

U.S. PATENT DOCUMENTS

6,301,028 B1 * 10/2001 Tanaka et al. ................. 359/22
6,320,683 B1 * 11/2001 Ito et al. ........................ 359/22
6,414,762 B1 * 7/2002 Yamaji et al. .................. 359/7

* cited by examiner

Primary Examiner—Drew A. Dunn
Assistant Examiner—Joshua L Pritchett
(74) Attorney, Agent, or Firm—McGinn & Gibb, PLLC

(57) ABSTRACT

In a hologram recording method for forming a plurality of areas of a refractive index light interference pattern of a coherent signal light beam in accordance with information data within a recording medium having a shape of parallel flat plates, the signal light beam and the recording reference light beam cross each other within the recording medium, and a gate light beam having a second wavelength for revealing recording sensitivity of the recording medium is simultaneously irradiated to the recording medium so as to pass through a portion of the recording reference light beam and demarcate a volume smaller than that of this crossing portion.

19 Claims, 8 Drawing Sheets

HOLOGRAM RECORDING MEDIUM, HOLOGRAM RECORDING METHOD AND HOLOGRAM RECORDING AND REPRODUCING APPARATUS

BACKGROUND OF THE INVENTION

1. Field of the Invention

The present invention relates to a recording medium made of a photo refractive material, i.e., a so-called holographic memory, and particularly relates to a hologram recording method and an optical information recording and reproducing apparatus utilizing the holographic memory.

2. Description of Related Art

A volume holographic recording system is known as a digital information recording system utilizing the principle of a hologram. This system is characterized in that an information signal is recorded onto a recording medium as a change in refractive index. A photo refractive material such as a lithium niobate monocrystal is used in the recording medium.

Explanation will be made for a recording and reproducing method using a Fourier transformation as an example of conventional hologram recording and reproducing methods.

As shown in FIG. 1, in a conventional 4f-system hologram recording and reproducing apparatus, a laser beam 12 emitted from a laser beam source 11 is divided into a signal light beam 12a and recording reference light beam 12b at a beam splitter 13. The diameter of the beam the signal light beam 12a is enlarged by a beam expander BX, and is irradiated as parallel light to a spatial light modulator SLM such as a panel of a TFT liquid crystal display (LCD) of a transmission type. The spatial light modulator SLM receives recording data converted to a signal by an encoder as an electric signal, and forms a light and dark dot pattern on a plane. When the signal light beam 12a is transmitted through the spatial light modulator SLM, the signal light beam 12a is optically modulated to include a data signal component. The signal light beam 12a including the dot pattern signal component is transmitted through a Fourier transformation lens 16 separated by its focal length f from the spatial light modulator SLM so that the dot pattern signal component is Fourier-transformed and is converged into a recording medium 10. In contrast, the recording reference light beam 12b divided in the beam splitter 13 is guided into the recording medium 10 by mirrors 18, 19, and crosses an optical path of the signal light beam 12a within the recording medium 10 so that a light interference pattern is formed. The entire light interference pattern is recorded as a change in refractive index.

Thus, diffracted light from image data which is irradiated by coherent parallel light is focused and formed as an image by the Fourier transformation lens, and is reformed to a distribution on a focal face of the Fourier transformation lens, i.e., on a Fourier face. The distribution of results of the Fourier transformation interferes with the coherent reference light, and its interference fringe is recorded to the recording medium in the vicinity of a focal point. After the recording operation on a first page is terminated, a rotatable mirror is rotated by a predetermined amount and its position is displaced in parallel by a predetermined amount so that an incident angle of the recording reference light beam 12b with respect to the recording medium 10 is changed. The recording operation on a second page is then performed in the same procedure. Thus, an angle multiplex recording is performed by executing the sequential recording operation.

On the other hand, a dot pattern image is reproduced by performing a reverse Fourier transformation at the time of reproduction. When reproducing information, as shown in FIG. 1, for example, the optical path of the signal light beam 12a is interrupted by the spatial light modulator SLM, and only the recording reference light beam 12b is irradiated to the recording medium 10. At the time of reproduction, a position and an angle of the mirror are changed and controlled in combination with the rotation and the linear movement of the mirror so as to provide the same incident angle as the recording reference light at the recording time of a reproduced page.

Reproduction light as a result of reproduction of the recorded light interference pattern appears on an opposite side of the recording medium 10 irradiated by the recording reference light beam 12b. When this reproduction light is guided to a reverse Fourier transformation lens 16a and the reverse Fourier transformation is performed, the dot pattern signal can be reproduced. Further, after this dot pattern signal is received by a photo detector 20 such as a charge coupled device CCD in a focal length position, the original data is reproduced by reconverting the received dot pattern signal to an electric digital data signal and then sending it to a decoder.

Thus, as shown in FIG. 2, the multiple recording has conventionally been made within the volume of about several millimeters in square using angle multiplex and wavelength multiplex to record information at high density within a certain volume within the recording medium. Therefore, coherent lengths of the signal light and the reference light are set to be long and wide in order to secure properties that allow selecting angle and wavelength broadly. This leads to a reduction in intensity per light unit used in the recording, the recording medium of high sensitivity is required. Furthermore, since the multiplex record is required to make the high density record, a recording medium having a large erasing time constant and able to be easily multiplexed is required. The recording medium having a large erasing time constant is generally low in recording sensitivity, and is a cause of the limited recording speed as a system.

Further, two lenses constituted by the Fourier transformation lens and the reverse Fourier transformation lens of high performance are required in the conventional device. Furthermore, it is necessary to arrange a paging control mechanism of high accuracy to control the reference light in the recording and the reproduction. Accordingly, a problem exists in that it is disadvantageous to make the system compact.

Furthermore, in the case of conventional arrangements the multiplex recording is executed in one portion of the recording medium, changes in refractive index of the recording medium due to the multiplex recording are added and a wave front of the reference light after the medium transmission is gradually changed. Therefore, the number of multiplexing is limited in order to reflect and set the reference light to reproducing reference light and perform the generation of phase conjugation. Furthermore, it has been necessary to arrange a light interrupting means for the reflected light so as to remove the overlapping of influences due to the formation of a diffraction grating in a reducing direction of the recording sensitivity in a multiplex recording time.

OBJECTS AND SUMMARY OF THE INVENTION

Therefore, an object of the present invention is to provide a hologram recording medium, a hologram recording method, a hologram recording and reproducing method and a hologram recording and reproducing apparatus capable of performing the recording at a higher density and are able to be made compact.

According to one aspect of the invention, a hologram recording medium is made of a photo refractive crystal of a uniaxial crystal having surfaces in a shape of parallel flat plates and has a plurality of areas of a refractive index grating corresponding to one portion of a three-dimensional light interference pattern of a coherent signal light beam and coherent reference light of a first wavelength modulated in accordance with information data, wherein each of the areas of the refractive index grating has a columnar shape, and the areas of the refractive index grating are adjacently arranged in parallel with each other.

According to another aspect of the invention, the photo refractive crystal is a crystal having a recording sensitivity at the first wavelength that increases when a gate light beam of a second wavelength is simultaneously irradiated in addition to the reference light and the signal light of the first wavelength.

According to a further aspect of the invention, the photo refractive crystal has an optical crystal axis approximately parallel or perpendicular to a main surface of the recording medium.

According to a still further aspect of the invention, information data of one screen is stored in each area of the refractive index grating.

According to another aspect of the invention, each of the areas of the refractive index grating of the columnar shape is extended approximately perpendicularly to the main surface of the hologram recording medium.

According to a further aspect of the invention, each of the areas of the refractive index grating of the columnar shape approximately has a cylindrical shape.

According to a still further aspect of the invention, a maximum inside diameter of the areas of the refractive index grating is smaller than the distance between peaks of zeroth-order and primary diffracted lights of a light intensity distribution of the signal light beam.

The present invention also resides in a hologram recording method for forming a plurality of areas of a refractive index grating corresponding to one portion of a three-dimensional light interference pattern of a coherent signal light beam and coherent reference light of a first wavelength modulated in accordance with information data within a recording medium made of a photo refractive crystal of a uniaxial crystal having a shape of parallel flat plates, wherein the signal light beam and the recording reference light beam cross each other within the recording medium, and a gate light beam having a second wavelength for revealing recording sensitivity of the recording medium is simultaneously irradiated onto the recording medium so as to pass through a portion of the recording medium for crossing the signal light beam and the recording reference light beam and demarcate a volume smaller than that of this crossing portion.

According to another aspect of the invention, the gate light beam is converged and the recording medium is arranged in the vicinity reaching a waist of this gate light beam, and the areas of the refractive index grating are formed in a columnar shape and are adjacently arranged in parallel with each other.

According to a further aspect of the invention, the recording medium has an optical crystal axis approximately parallel or perpendicular to a main surface of the recording medium.

According to a still further aspect of the invention, the recording reference light beam and the gate light beam are coaxially irradiated.

According to another aspect of the invention, the recording reference light beam is converged.

According to a further aspect of the invention, the recording reference light beam and the gate light beam are approximately perpendicularly irradiated to a main surface of the recording medium, and the areas of the refractive index grating of the columnar shape are approximately perpendicularly extended to the main surface of the recording medium.

According to a still further aspect of the invention, the gate light beam and the signal light beam are respectively irradiated such that a cross sectional area of the gate light beam on the surface of the recording medium is smaller than that of the signal light beam.

According to another aspect of the invention, each of the areas of the refractive index grating of the columnar shape is approximately formed in a cylindrical shape.

According to a further aspect of the invention, a maximum inside diameter of the areas of the refractive index grating is smaller than the distance between peaks of zeroth-order and primary diffracted lights of a light intensity distribution of the signal light beam.

The present invention further resides in a hologram recording and reproducing apparatus for forming a plurality of areas of a refractive index grating corresponding to one portion of a three-dimensional light interference pattern of a coherent signal light beam and coherent reference light of a first wavelength modulated in accordance with information data within a recording medium made of a photo refractive crystal of a uniaxial crystal having a parallel flat plate shape, the hologram recording and reproducing apparatus comprising:

a supporting section for detachably holding the recording medium made of the photo refractive crystal having the parallel flat plate shape;

a reference light section for making a coherent recording reference light beam of a first wavelength approximately perpendicularly incident to a main surface of the recording medium;

a signal light section for making the coherent signal light beam of the first wavelength modulated in accordance with the information data of one screen incident to the recording medium, and making the coherent signal light beam cross the recording reference light beam within the recording medium, and generating a light interference pattern of the signal light beam and the recording reference light beam;

a gate light section for making a gate light beam of a second wavelength for revealing recording sensitivity of the recording medium approximately perpendicularly incident to the main surface of the recording medium together with the recording reference light beam, and forming a refractive index grating of one portion of the light interference pattern which passes through a portion of the recording medium for crossing the signal light beam and the recording reference light beam and demarcates a volume smaller than that of this crossing portion;

a phase conjugate wave generating section for generating a phase conjugate wave with respect to the signal light beam by irradiating a reproducing reference light beam coaxial with respect to the recording reference light beam and propagated in an opposite direction to the refractive index grating of the recording medium;

a separating section for separating the phase conjugate wave from an optical path of the signal light beam; and a detecting section for detecting the information data formed as an image by the phase conjugate wave.

According to another aspect of the present invention, the hologram recording and reproducing apparatus further comprises a section for converging the gate light beam and the recording medium is arranged in the vicinity reaching a waist of the gate light beam, and the areas of the refractive index grating are formed in a columnar shape and are adjacently arranged in parallel with each other.

According to a further aspect of the present invention, the recording medium has an optical crystal axis approximately parallel or perpendicular to a main surface of the recording medium.

According to a still further aspect of the present invention, the hologram recording and reproducing apparatus further comprises a section for coaxially irradiating the recording reference light beam and the gate light beam.

According to another aspect of the present invention, the hologram recording and reproducing apparatus further comprises a section for converging the recording reference light beam.

According to a further aspect of the present invention, the recording reference light beam and the gate light beam are approximately perpendicularly irradiated to a main surface of the recording medium, and the areas of the refractive index grating of the columnar shape are approximately perpendicularly extended to the main surface of the recording medium.

According to a still further aspect of the present invention, the gate light beam and the signal light beam are respectively irradiated such that a cross sectional area of the gate light beam on the surface of the recording medium is smaller than that of the signal light beam.

According to another aspect of the present invention, each of the areas of the refractive index grating of the columnar shape is approximately formed in a cylindrical shape.

According to a further aspect of the present invention, a maximum inside diameter of the areas of the refractive index grating is smaller than the distance between peaks of zeroth-order and primary diffracted lights of a light intensity distribution of the signal light beam.

The present invention also resides in a hologram recording and reproducing method for recording and reproducing information using a hologram comprising: a recording step including the steps of; providing a recording medium made of a photo-refractive crystal of a uniaxial crystal having a shape of parallel flat plates; converging a coherent recording reference light beam onto the recording medium arranged at an upstream side and in a vicinity of a beam waist of the recording reference light beam passing there through in such manner that the recording reference light beam is irradiated to a main surface of the recording medium; and converging a coherent signal light beam of a first wavelength modulated in accordance with information data onto the recording medium to intersect with the recording reference light beam within the recording medium to form a region of the refractive index grating in a columnar shape extended from the main surface of the recording medium, so that a plurality of the regions of the refractive index grating can be adjacently arranged in parallel with each other correspondingly to a portion of a three-dimensional optical interference pattern of the signal light beam and the reference light beam; and a reproducing step including the steps of; converging and passing the recording reference light beam to the main surface of the recording medium; and reflecting the recording reference light beam at the beam waist or its vicinity thereof to generate a reproducing reference light beam coaxial with the recording reference light beam going back to the recording medium to propagate the reproducing reference light beam in an opposite direction into the refractive index grating of the recording medium to generate a phase conjugate wave.

According to one aspect of the hologram recording and reproducing method of the present invention, a gate light beam having a second wavelength for enhancing a recording sensitivity of the recording medium is irradiated to the recording medium coaxially with respect to the recording reference light beam so as to pass through a portion of the recording medium for crossing the signal light beam and the recording reference light beam and demarcate a volume smaller than that of the portion for crossing the signal light beam and the recording reference light beam in the recording step.

According to another aspect of the hologram recording and reproducing method of the present invention, the recording medium has an optical crystal axis approximately parallel or perpendicular to the main surface of the recording medium.

According to a further aspect of the hologram recording and reproducing method of the present invention, the light beams are respectively irradiated such that a cross sectional area of the gate light beam or the recording reference light beam on a surface of the recording medium is smaller than that of the signal light beam.

According to a still further aspect of the hologram recording and reproducing method of the present invention, each of the areas of the refractive index grating of the columnar shape is approximately formed in a cylindrical shape.

According to another aspect of the hologram recording and reproducing method of the present invention, a maximum inside diameter of the areas of the refractive index grating is smaller than the distance between peaks of zeroth-order and primary diffracted lights of a light intensity distribution of the signal light beam.

The present invention also resides in a hologram recording and reproducing apparatus for forming plural areas of a refractive index grating corresponding to one portion of a three-dimensional optical interference pattern of a coherent signal light beam and coherent reference light of a first wavelength modulated in accordance with information data within a recording medium made of a photo-refractive crystal of a uniaxial crystal having a parallel flat plate shape, the hologram recording and reproducing apparatus comprising:

a supporting section for detachably holding the recording medium made of the photo-refractive crystal having the parallel flat plate shape;

a reference light section for making a coherent recording reference light beam of the first wavelength convergent and approximately perpendicularly incident to a main surface of the recording medium;

a signal light section for making the coherent signal light beam of the first wavelength modulated in accordance with the information data of one screen incident to the recording medium, and making the coherent signal light beam cross the recording reference light beam within the recording medium, and generating a optical interference pattern of the signal light beam and the recording reference light beam;

a gate light section for making a gate light beam of a second wavelength for enhancing a recording sensitivity of the recording medium convergent and approximately perpendicularly incident to the main surface of the recording medium coaxially with respect to the recording reference light beam, and forming the refractive index grating of one portion of the optical interference pattern which passes through a portion of the recording medium for crossing the signal light beam and the recording reference light beam and demarcates a volume smaller than that of this crossing portion;

a phase conjugate wave generating section which includes a plane mirror arranged in the vicinity of a beam waist of the recording reference light approximately perpendicularly incident to the main surface of the recording medium, and generates a phase conjugate wave with respect to the signal light beam by irradiating a reproducing reference light beam coaxial with respect to the recording reference light beam and propagated in an opposite direction to the refractive index grating of the recording medium by the plane mirror;

a separating section for separating the phase conjugate wave from an optical path of the signal light beam; and a detecting section for detecting the information data formed as an image by the phase conjugate wave.

According to one aspect of the hologram recording and reproducing apparatus of the present invention, the supporting section has a moving mechanism for moving the recording medium such that the areas of the refractive index grating are formed in a columnar shape and are adjacently arranged in parallel with each other.

According to another aspect of the hologram recording and reproducing apparatus of the present invention, the recording medium has an optical crystal axis approximately parallel or perpendicular to the main surface of the recording medium.

According to a further aspect of the hologram recording and reproducing apparatus of the present invention, the gate light beam and the signal light beam are respectively irradiated such that a cross sectional area of the gate light beam on the surface of the recording medium is smaller than that of the signal light beam.

A reproducing method using a phase conjugate wave is considered as one of methods for making a hologram memory system compact. Phase conjugate reference light (hereinafter called reproducing reference light) at a recording time with respect to reference light (hereinafter called recording reference light) at the recording time is used to realize this reproducing method using the phase conjugate wave. Namely, the phase conjugate wave reproducing method at the recording time is the same as the conventional case. However, in this reproducing method, at a reproducing time, phase conjugate light of the signal light is generated in an incident direction of the signal light by using the phase conjugate reproducing reference light having a symmetrical property opposed to that of the reference light at the recording time so that a Fourier transformation lens can be also used as a reverse Fourier transformation lens. Further, even when the phase of a wave front of the phase conjugate light is disturbed by passing this phase conjugate light through the recording medium and the lens, there is a nature of the phase conjugate light in which the phase disturbance is compensated and returned to its original state when the phase conjugate light again reversely passes through the recording medium and the lens. Accordingly, the recording and reproducing apparatus can be constructed by using a simple lens without requiring a lens of high performance thanks to the nature of the phase conjugate light. Therefore, the recording reproducing method is very effective to make the recording and reproducing apparatus compact in size.

Thus, in the case of the phase conjugate reproducing method, it is necessary to set the recording reference light and the reproducing reference light to have the symmetrical properties. Therefore, symmetrically opposed plane waves are generally used, but are realized here by perpendicularly reflecting the plane waves on a plane mirror.

DETAILED DESCRIPTION OF THE EMBODIMENTS

Figure 1:
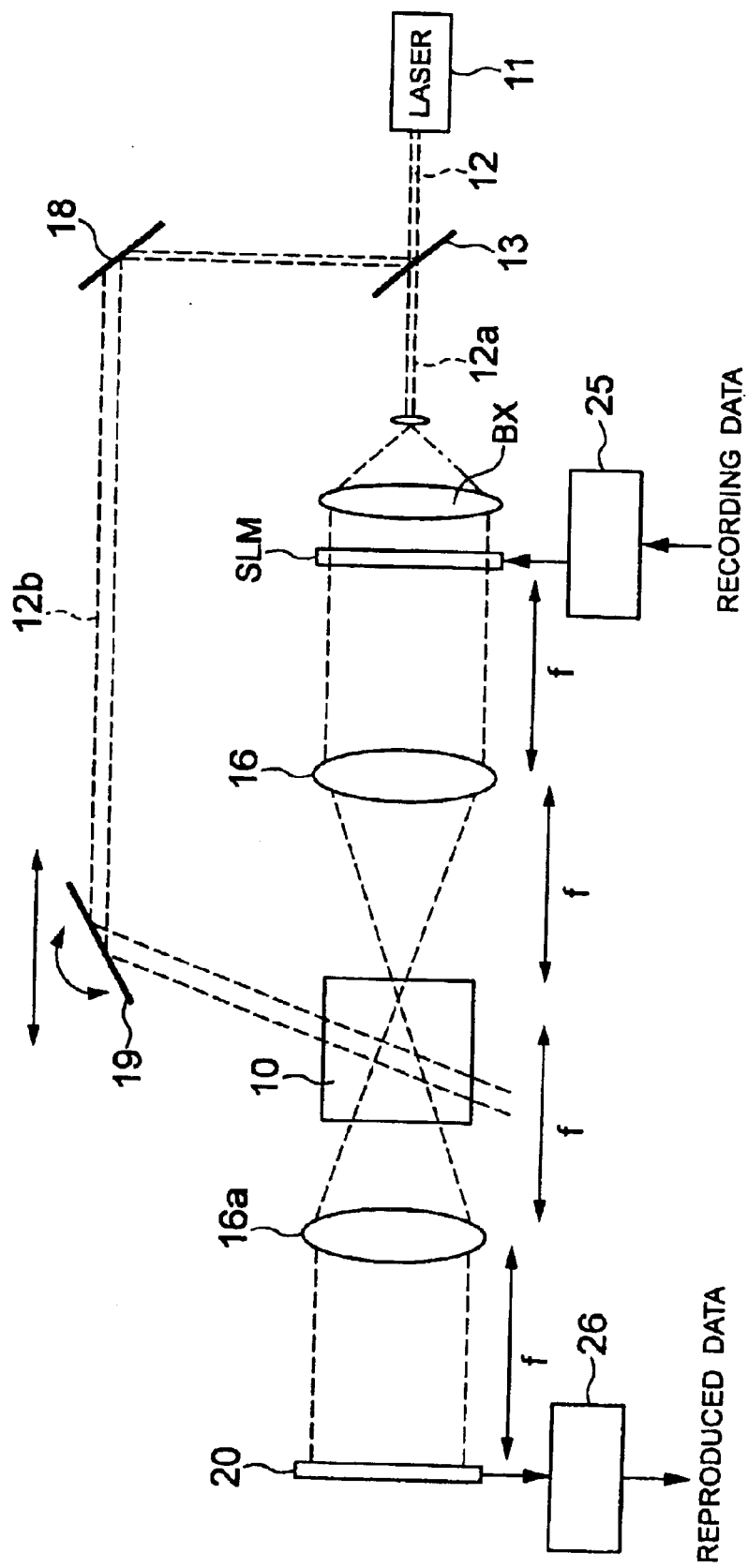
FIG. 1 is a schematic view showing the construction of a conventional hologram recording system.
Figure 2:
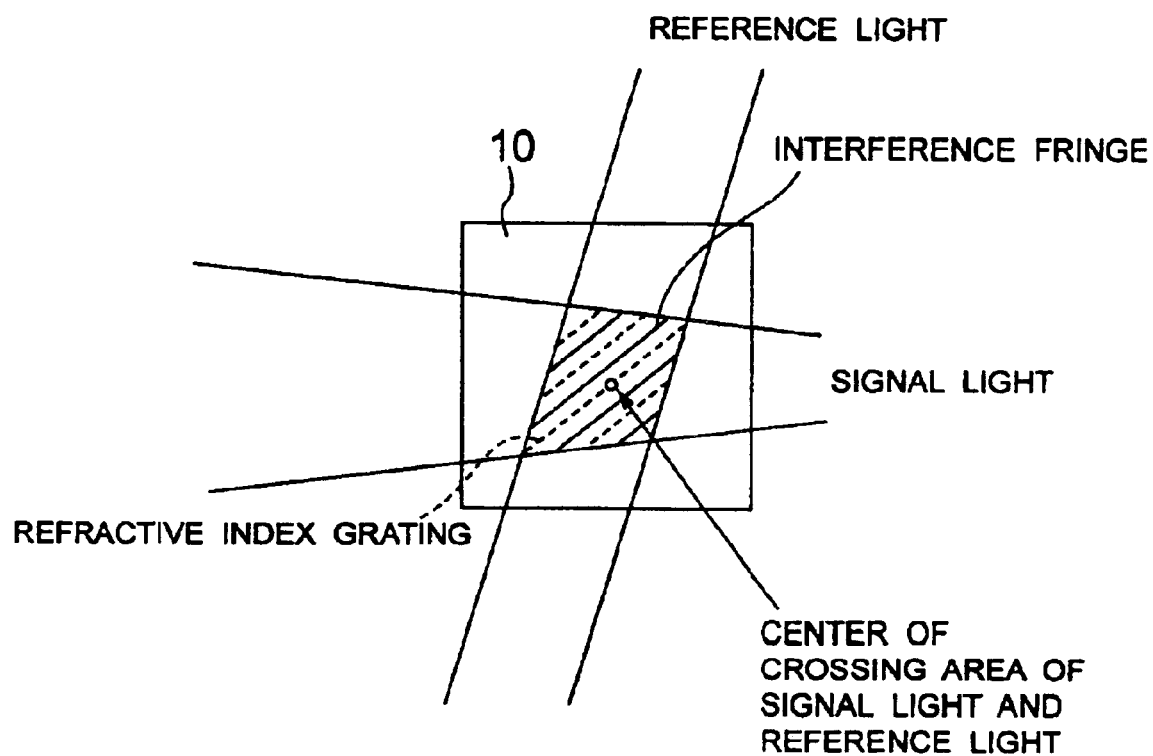
FIG. 2 is a schematic sectional view showing a hologram recording medium.

The embodiments of the present invention will next be explained with reference to the accompanying drawings.

A reproducing method using a phase conjugate wave is considered as one of methods for making a hologram memory system compact. Phase conjugate reference light (hereinafter called reproducing reference light) in a recording time with respect to reference light (hereinafter called recording reference light) in the reproduction time is used to realize this reproducing method using the phase conjugate wave. Namely, the phase conjugate wave reproducing method in the reproduction time is the same as the conventional case. However, in this reproducing method, at a reproduction time, the phase conjugate light of signal light is generated in an incident direction of the signal light by using the phase conjugate reproducing reference light having a symmetrical property opposed to that of the reference light in the reproduction time so that a Fourier transformation lens can be also used as a reverse Fourier transformation lens. Further, even when the phase of a wave front of the phase conjugate light is disturbed by passing this phase conjugate light through the recording medium and the lens, there is a nature of the phase conjugate light in which the phase disturbance is compensated and returned to its original state when the phase conjugate light again reversely passes through the recording medium and the lens. Accordingly, the recording and reproducing apparatus can be constructed by a simple lens without requiring any high performance in the lens by this nature. Therefore, the recording reproducing method is very effective to make the recording and reproducing apparatus compact.

Thus, in the phase conjugate reproducing method, it is necessary to set the recording reference light and the reproducing reference light to have the symmetrical properties. Therefore, symmetrically opposed plane waves are generally used. However, the symmetrical property is here realized by perpendicularly reflecting the plane wave on a plane mirror. In this embodiment mode, light power density is increased and a high speed recording operation is achieved even in a small light amount by converging the recording light (recording reference light and signal light) to a very small area. The reference light is perpendicularly incident to a main surface of the recording medium, and the plane mirror is arranged in a beam waist of the reference light, and the reference light is perpendicularly reflected on the plane mirror. The signal light is incident to the recording medium at an acute angle with respect to the reference light. Gate light is coaxial with respect to the reference light and is beam-shaped by a converging method similar to that of the reference light, and is incident to the recording medium.

When a reference light beam has a certain degree of diameter, it is possible to form a cylindrical sector since the influence of a diffraction phenomenon is small and there is almost no changing ratio of the beam diameter even when the reference light beam is shaped by limiting one portion of parallel light with a lens and a diaphragm. The wave fronts of the reproducing reference light and the recording reference light can be set to the same by perpendicularly reflecting this reference light on the plane mirror in an arbitrary position and opposing this reference light. However, in a recording case to a very small (about several ten $\mu$m) area, no cylindrical very small sector can be maded by the diffraction phenomenon in a limit using the diaphragm (pin hole). Therefore, in this embodiment mode, a sector approximately having a cylindrical shape is used by the reference light near the plane wave gently converged by a lens having a long focal length, or a recording sector having a truncated conical shape is used by the reference light of a spherical wave. At this time, the plane mirror is arranged in the position of the beam waist of the recording reference light and the recording reference light is reflected and opposed to obtain the reproducing reference light by utilizing the reflection of the recording reference light. Thus, the reproducing reference light similar to the recording reference light is obtained so that the wave fronts of both the lights can be set to the same.

Figure 3:
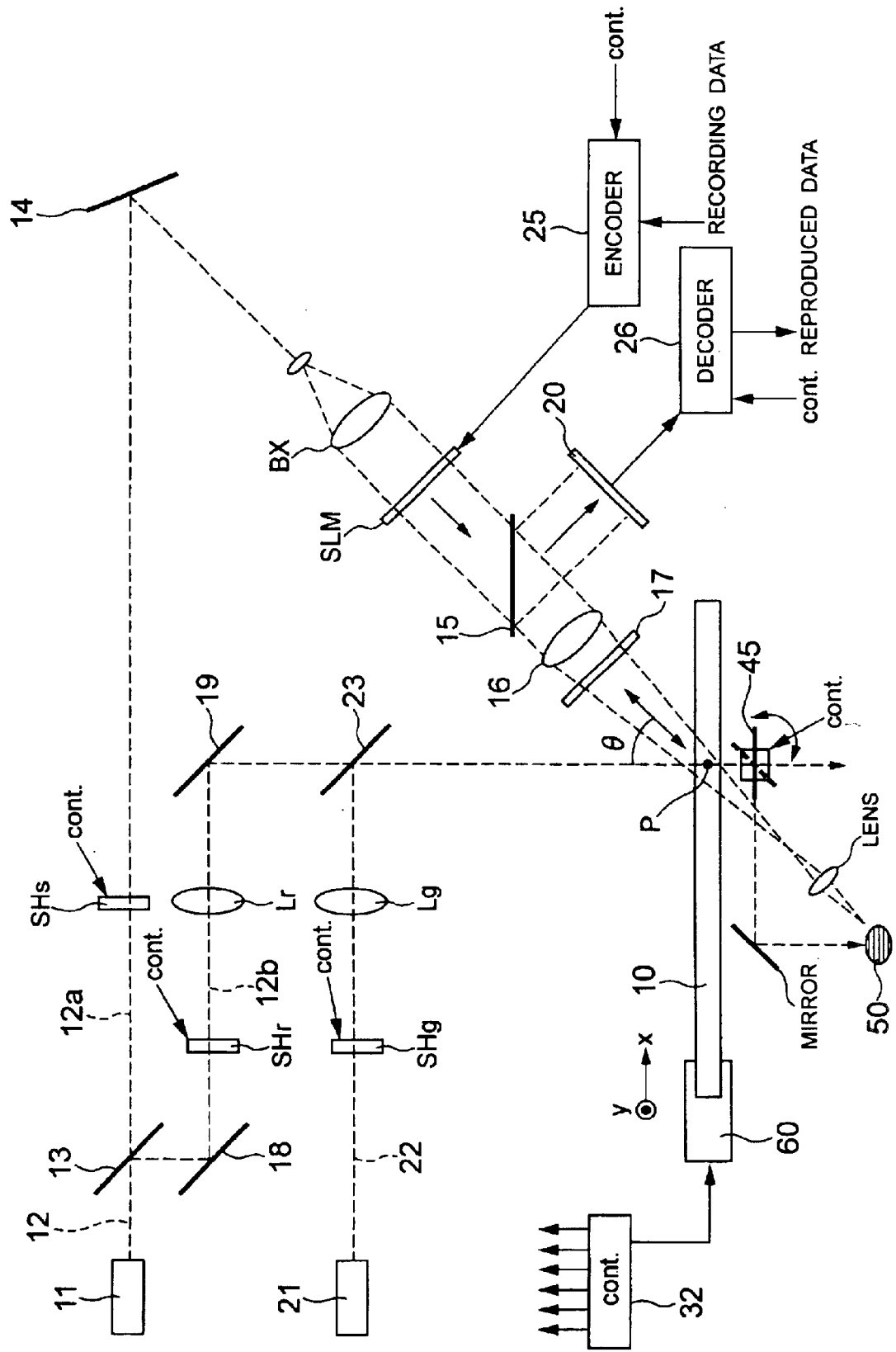
FIG. 3 is a schematic view for explaining a hologram recording and reproducing apparatus according to the present invention.

As shown in FIG. 3, a DBR (Distributed Bragg Reflector) laser of a long first wavelength, e.g., 850 nm is used as a near infrared laser beam source in a light source 11 for generating signal light and reference light. A laser beam 12 emitted from the laser beam source 11 is divided into signal light beam 12a and recording reference light beam 12b by a beam splitter 13. A shutter SHs, a mirror 14, a beam expander BX, a spacial light modulator SLM, a beam splitter 15, a Fourier transformation lens 16 and a phase modulating plate 17 are arranged on an optical path of the signal light beam 12a. In contrast to this, a shutter SHr and a convergent lens Lr are arranged between mirrors 18 and 19 on an optical path of the recording reference light beam 12b divided in the beam splitter 13. At a recording time, the signal light beam 12a and the recording reference light beam 12b are irradiated to a crossing position P within a recording medium 10 of a parallel flat plate shape along the different optical paths. Namely, when the shutters SHs and SHr are opened, a beam of the signal light beam 12a is slantingly irradiated to a main surface of the recording medium at a predetermined incident angle θ by the mirror 14, and a beam of the recording reference light beam 12b is approximately perpendicularly irradiated to the main surface of the recording medium by the mirror 19. These beams interfere with each other within the recording medium 10.

For example, when lithium niobate having a composition close to a stoichiometric mixture ratio obtained by adding 100 ppm of terbium (Tb) and 5 ppm of iron (Fe) is used as the recording medium 10, the recording medium 10 has little sensitivity with respect to near infrared light if the recording medium is used as it is. Therefore, the recording sensitivity is enhanced by simultaneously irradiating gate light to the recording medium 10. The recording sensitivity is revealed only in the recording medium in a passing portion of the gate light within a crossing portion of the signal light and the reference light. Accordingly, when the gate light is converged by the convergent lens and is incident to the recording medium, for example, the hologram of a cylindrical passing portion is recorded. Further, the density of recording light intensity can be raised by diametrically narrowing the recording reference light until a beam diameter equivalent to that of the gate light so that a high speed recording operation can be also performed in the recording medium of low recording sensitivity and the light source of a low output. Thus, the photo refractive material such as $LiNbO_3$ with Tb added thereto is normally colorless and transparent, but visible light absorption is revealed by irradiating an ultraviolet ray, etc. to this photo refractive material so that an irradiating portion is colored. When the visible light is irradiated to the material in the coloring portion, induced absorption (recording sensitivity) is caused in a near infrared area. In contrast to this, when no ultraviolet ray is irradiated to the material, the recording sensitivity with respect to the near infrared light is extremely reduced. Accordingly, since the hologram record is made by setting the ultraviolet ray to the gate light and setting the near infrared ray to the signal light and the reference light, a mode of this record is called a two-color hologram.

A He—Cd laser of a second wavelength, e.g., 325 nm in wavelength in a band of the ultraviolet ray or the visible light of a short wavelength is used in the light source 21 for generating the gate light. The light source 21 for generating the gate light is a light source having power sufficient to reveal the light induced absorption of the recording medium 10, i.e., color the recording medium 10 by irradiation light of the light source. When a shutter SHg is opened at the recording time, the gate light 22 emitted from the light source 21 for generating the gate light is reflected on a half mirror 23 through the shutter SHg and a convergent lens Lg, and is irradiated approximately perpendicularly to a main surface of the recording medium 10. Accordingly, both the beams of the recording reference light and the gate light are coaxially irradiated. The convergent lens Lg converges the gate light beam 22 and irradiates its spot by reducing the beam diameter so as to form a columnar passing area in a crossing position P within the recording medium 10. Accordingly, the recording medium 10 is arranged in the vicinity reaching a beam waist of the gate light 22. The shutters SHs, SHr and SHg are arranged to open and close optical paths of the light beams 12a, 12b and 22. Each of the shutters is opened and closed by a signal sent by a controller 32 through a driver.

As shown in FIG. 3, a rotatable plane mirror 45 is arranged just near the recording medium 10 on an opposite side of the recording medium 10 on the optical path of the recording reference light beam 12b. The plane mirror 45 is used to generate a phase conjugate wave at a reproducing time. At the reproducing time, the plane mirror 45 is fixed such that the plane mirror 45 is opposed to the recording reference light beam 12b passing through the recording medium 10, i.e., the recording reference light beam 12b is perpendicularly incident to the plane mirror 45. Accordingly, phase conjugate reproduction is performed from the recorded hologram by arranging the plane mirror 45 in a position of the beam waist of the recording reference light beam 12*b*. When the recording reference light beam 12*b* is irradiated in reproduction operation, the recording reference light beam 12*b* passes through the recording medium 10 and is regularly reflected on the plane mirror 45 and is changed to reproducing reference light beam 12*c*. This reproducing reference light beam 12*c* is again incident to the recording medium 10 so that diffracted light (phase conjugate light as the reproducing light) is obtained by the recording medium 10. In contrast to this, at the recording time, the plane mirror 45 is rotated under the control of the controller 32 to prevent stray light and is fixed such that the recording reference light beam 12*b* is guided to a light absorber 50 such as a charcoal plate close to e.g., a perfect black body. The light transmitted through the recording medium is converged by a lens on the optical path of the signal light beam 12*a* so as to provide a predetermined beam diameter to reduce the stray light of the signal light. Thereafter, the converged light is guided to the light absorber 50 or a light absorber of the same kind arranged separately from the light absorber 50.

The beam expander BX enlarges the beam diameter of the signal light beam 12*a* passing through the shutter SHs on the optical path of the signal light beam 12*a* inclined with respect to the recording medium, and changes the signal light beam 12*a* to parallel light. The beam expander BX then irradiates the parallel light such that this parallel light is perpendicularly incident to the spatial light modulator SLM. The spatial light modulator SLM receives electric data of a unit page series corresponding to a two-dimensional plane page received from an encoder 25, and displays a light and dark dot matrix signal. The signal light beam 12*a* is optically modulated by passing through the spatial light modulator SLM so that the signal light beam 12*a* includes the data as a dot matrix component. Further, the Fourier transformation lens 16 effects Fourier-transformation on the dot matrix component of the signal light beam 12*a* transmitted through the beam splitter 15, and converges the signal light beam 12*a* so as to focus and form a focal point behind the position P of the recording medium 10. The beam splitter 15 supplies the phase conjugate wave described later to a CCD 20 as a light receiver. The spatial light modulator SLM and the CCD 20 are arranged at a focal length of the Fourier transformation lens 16. It is possible to alleviate the convergence of zeroth-order light to one point using this Fourier transformation lens by arranging the phase modulating plate 17 between the spatial light modulator and the recording medium so that the unbalance of a power ratio with respect to a modulated signal component can be also alleviated.

Further, an image pickup element of a photo detector array, e.g., the CCD 20 is arranged in such a way that it is branched off from the beam splitter 15. The beam splitter 15 is arranged in a position able to send the phase conjugate wave to the CCD 20. A decoder 26 is connected to the CCD 20. The decoder 26 is connected to the controller 32. When a mark corresponding to the kind of a photo refractive crystal is formed on the recording medium 10 in advance and the recording medium 10 is mounted onto a movable stage 30 as a supporting means for moving this recording medium 10, the controller 32 automatically reads this mark by a suitable sensor, and can control the movement of the recording medium.

A two-color hologram recording process procedure will next be described.

Figure 4:
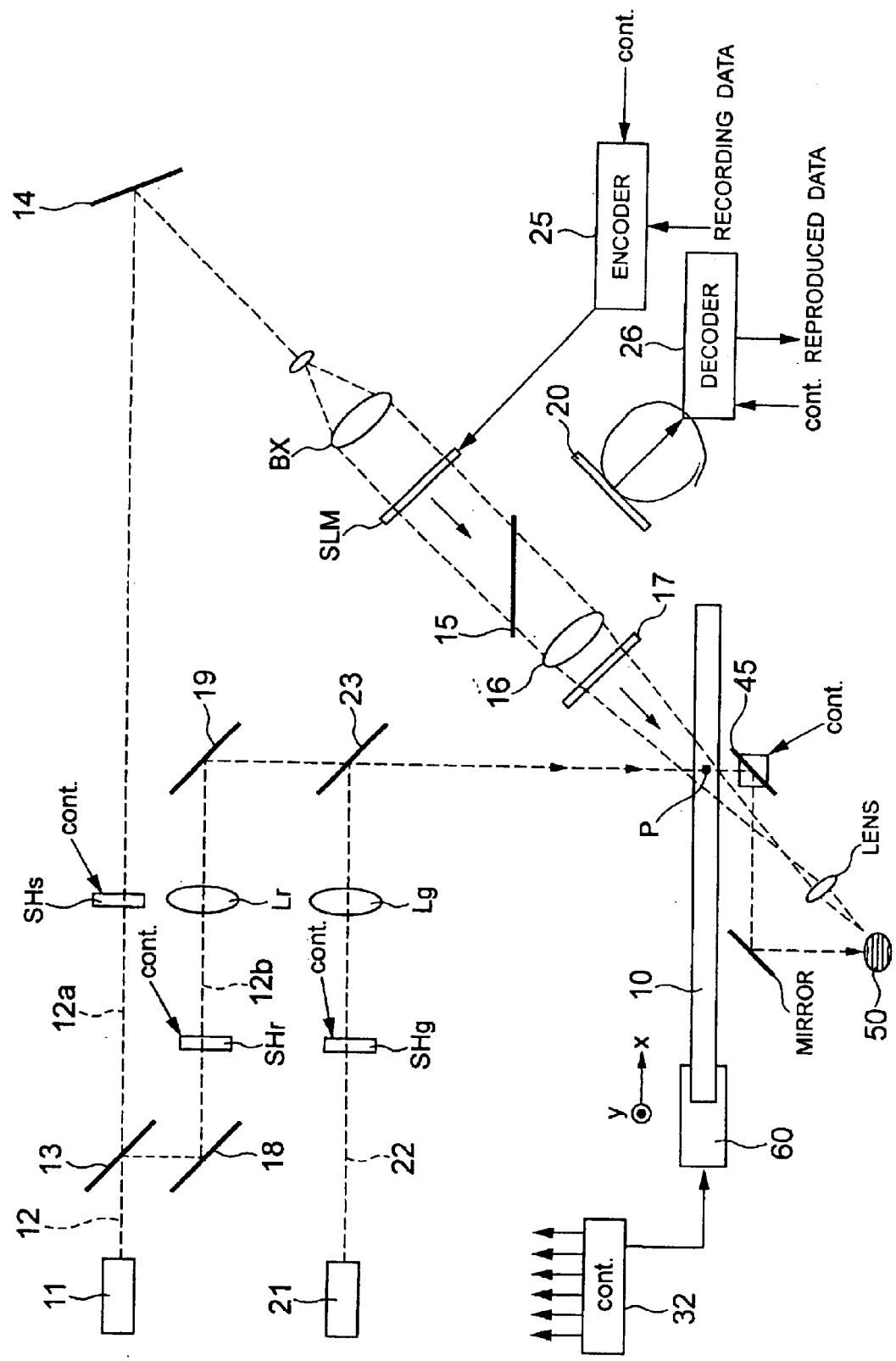
FIG. 4 is a schematic view for explaining a recording process in the recording and reproducing apparatus in the present invention.

First, as shown in FIG. 4, the plane mirror 45 is rotated to a position where a stray light preventing state is attained and is fixed such that the recording reference light beam 12*b* and the gate light 22 are not regularly reflected. Next, the recording medium 10 as an object is moved to a predetermined position by controlling the position of an n (n=1 or 2) axis movable stage 60 holding the recording medium 10 by the controller 32. Next, a recording signal is sent from the encoder 25 to the spatial light modulator SLM, and a predetermined pattern is displayed. Next, the shutter SHg is opened and a portion already recorded by preceding irradiation of the gate light is erased and the recording operation is started by opening the shutters SHs, SHr together with the irradiation of the gate light. Next, the recording operation is performed for a predetermined time controlled by the controller 32, i.e., the lights interfere with each other. Next, the shutters SHg, SHr, SHs are closed. Next, the plane mirror 45 is rotated and returned to a regular reflecting state and is fixed. The recording operation is thus completed and a light interference pattern of the reference light and the signal light is formed within the recording medium 10, and the recording medium is partially excited by the gate light so that information is recorded as a change in refractive index. After the recording operation on a first page is terminated, the recording medium 10 is moved by a predetermined amount and the position of the recording reference light beam 12*b* with respect to the recording medium 10 is changed and the recording operation on a second page is performed by the same procedure. Thus, the recording operation is performed by sequentially performing recording processes.

Figure 5:
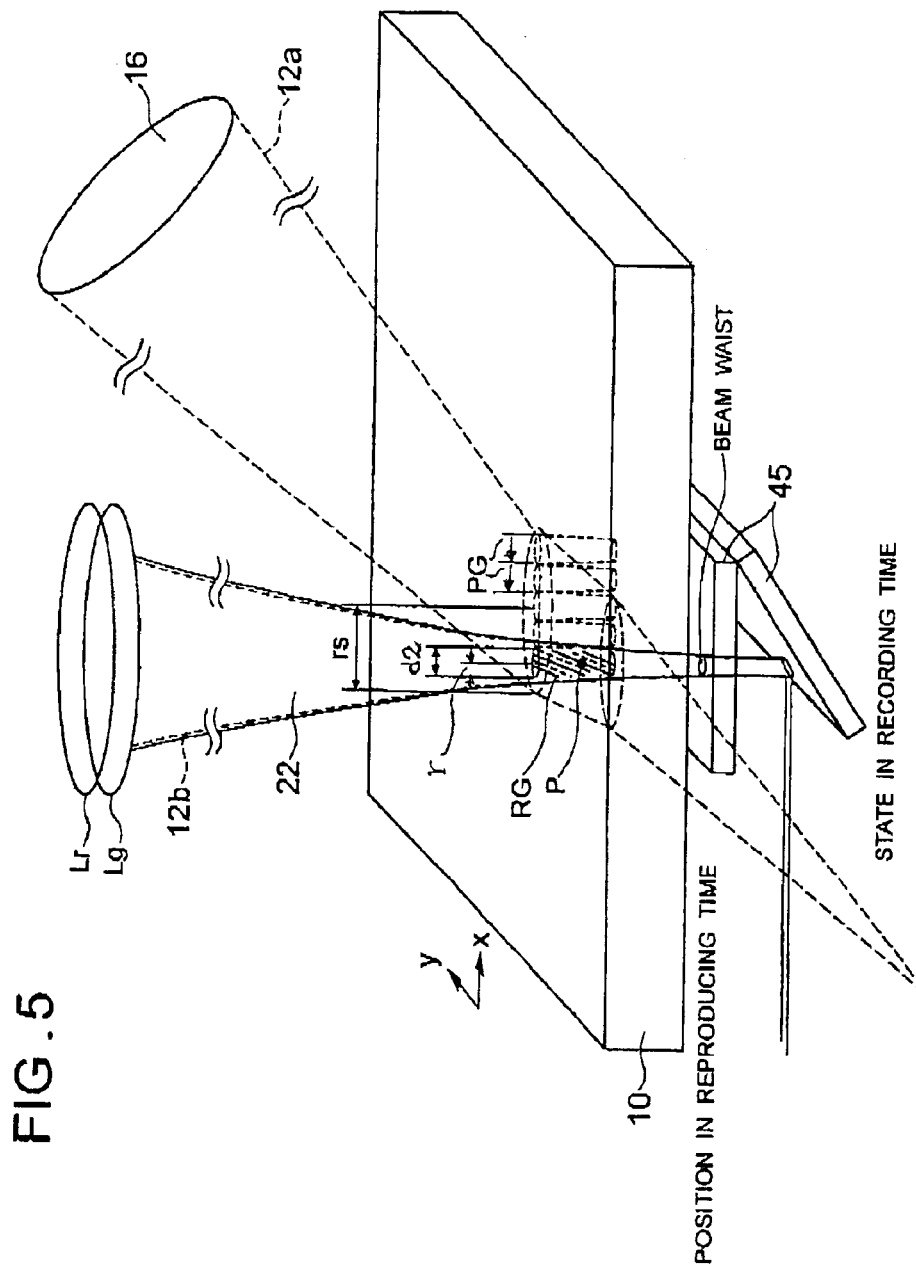
FIG. 5 is a schematic perspective view showing the hologram recording medium of an embodiment mode in the present invention.

FIG. 5 shows an example of the state where the gate light, the recording reference light and the signal light is incident into the recording medium. Each of areas RG of a refractive index grating approximately having a cylindrical shape is approximately perpendicularly extended to the main surface of the hologram recording medium 10. For example, the gate light beam or the recording reference light beam and the gate light beam of a radius r which are approximately perpendicularly incident into the recording medium main surface, and the signal light beam of a radius rs on the same main surface are incident such that a condition of rs>r is satisfied as in a case of e.g., r=30 $\mu$m and rs=100 $\mu$m. Further, it is preferable to have a sufficient length with respect to thickness T of the recording medium 10, e.g., T/r>2 so as to record information approximately in a cylindrical shape.

Figure 6:
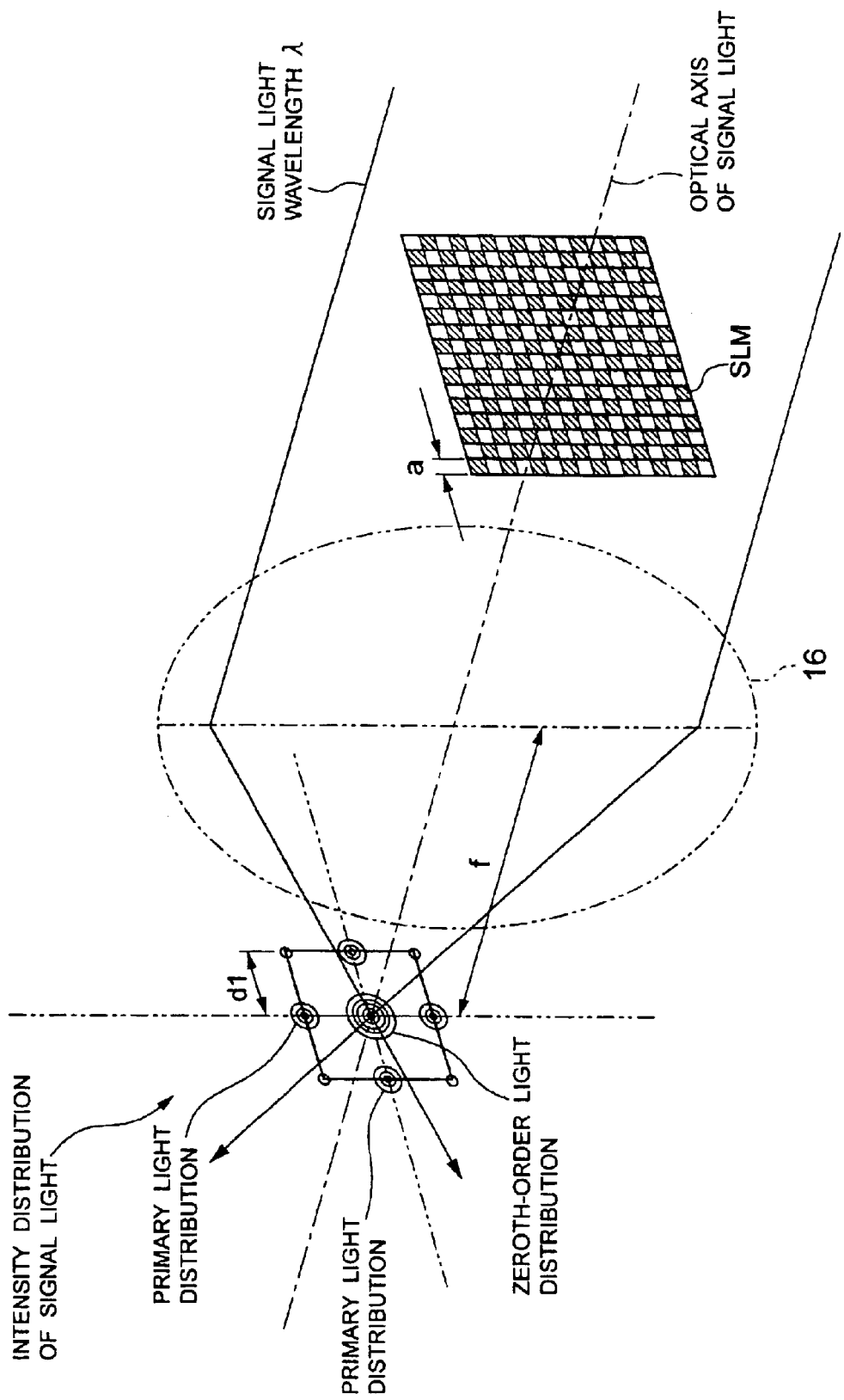
FIG. 6 is a schematic view for explaining the recording process in the hologram recording and reproducing apparatus in the present invention.

Further, a case where a refractive index changing areas of the recording reference light and the signal light are limited by using the gate light will be considered. In the signal light Fourier-transformed by the SLM in the hologram record of the Fourier transformation, primary diffracted light caused by repeating pixels (pitch is set to a) of the SLM becomes a maximum frequency component. As shown in FIG. 6, when the recording operation is performed within the recording medium 10 by the interference of the signal light and the reference light, spatial frequency spectrum distribution light intensity is caused on a Fourier face.

The distance (d1) between zeroth-order and primary Fourier spectra on the Fourier face can be represented by $d1 = (1/a) \cdot (\lambda) \cdot (f)$ using a spatial frequency (1/a) on a recording face, a light wavelength ($\lambda$) and a focal length (f) of the Fourier transformation lens.

FIG. 6 shows the intensity distribution of a Fourier transformation image. When the refractive index of the recording medium is equal to 2 and the thickness of the recording medium is 3 mm, and the optical system of the device according to the embodiment is a 1000×1000 SLM of a TFT LCD and a pixel pitch is 10 $\mu$m and a signal light wavelength is 530 nm and a focal length is 14 mm, the Fourier spectrum distance (d1) corresponding to this case becomes about 750 µm from the above formula. Accordingly, a large part of information of the signal light exists in a range of about ±750 µm from an optical axis. As shown in FIG. 6, two-dimensional data appearing in the spatial light modulator are scattered within the space of a grid type constructed by this primary diffracted light and the zeroth-order light.

Therefore, a large part of a fundamental wave component which is important in the recording is concentrated on the periphery of the zeroth-order light. Accordingly, information of a higher harmonic wave component near the primary diffracted light of the pixels relatively becomes less important.

Therefore, in the present invention, the diameter (d2) of the gate light is set to d1>d2 with respect to the Fourier spectrum distance (d1) even when the Fourier spectra of the signal light adjacent to each other in the recording are overlapped with each other. Further, areas limited and recorded by the gate light are set such that these areas are adjacent to each other without overlapping, i.e., a gate light pitch PG is set to PG≧d2. Thus, information can be multiplexed and recorded in closest packing by a periodic spatial arrangement.

Accordingly, in the present invention, an area of each refractive index grating has a columnar shape in the photo refractive crystal hologram recording medium of a uniaxial crystal of a parallel flat plate shape having a plurality of areas of the refractive index grating corresponding to one portion demarcated by the gate light within the interference pattern of the signal light and the recording reference light. The areas of the refractive index grating are adjacently arranged in parallel with each other.

A beam of the signal light approximately having a zero incident angle to the recording medium and a beam of the recording reference light at an incident angle θ generate an interference fringe at an angle of θ/2 with respect to an optical coaxis of these beams. In the photo refractive crystal, recording sensitivity is high in a direction in which the direction of the generated diffraction grating is perpendicular to its optical crystal axis. Accordingly, the recording medium for setting the optical crystal axis extended at an angle of 90−θ/2 with respect to the optical axis is preferable. However, if the signal light and the incident angle θ are reduced, a pickup device can be made compact. Accordingly, in the hologram recording medium, it is also preferable to arrange the optical crystal axis approximately in parallel with its main surface.

In FIG. 3, the optical crystal axis of the recording medium is set to be approximately parallel to a main surface direction of the parallel flat plate. In the recording time, the diffraction grating is formed in the direction of a bisector of a forming angle of the recording reference light and the signal light. At this time, recording sensitivity is used at its maximum when the direction of this diffraction grating is perpendicular to the optical crystal axis of the recording medium. The recording sensitivity is reduced in a trigonometric function as the direction of the diffraction grating is shifted from the perpendicular direction. Namely, the diffraction grating formed by the recording reference light and the signal light is close to the direction perpendicular to the optical crystal axis, and the transmission type hologram is easily recorded. However, the diffraction grating (reflection type hologram) constructed by the reference light and the signal light reflected on the reflecting mirror is close to a direction parallel to the optical axis of the recording medium so that the recording sensitivity is very small and no hologram is easily recorded.

In the reproduction time, the light reflected on the reflecting mirror acts as reproducing reference light so that diffracted light (reproducing conjugate light) is obtained from the recording medium. The normal hologram is naturally reproduced by the incident light, but has no influence on the phase conjugate reproduction since diffracting directions are different from each other.

A processing procedure of the two-color hologram reproduction will next be described.

Figure 7:
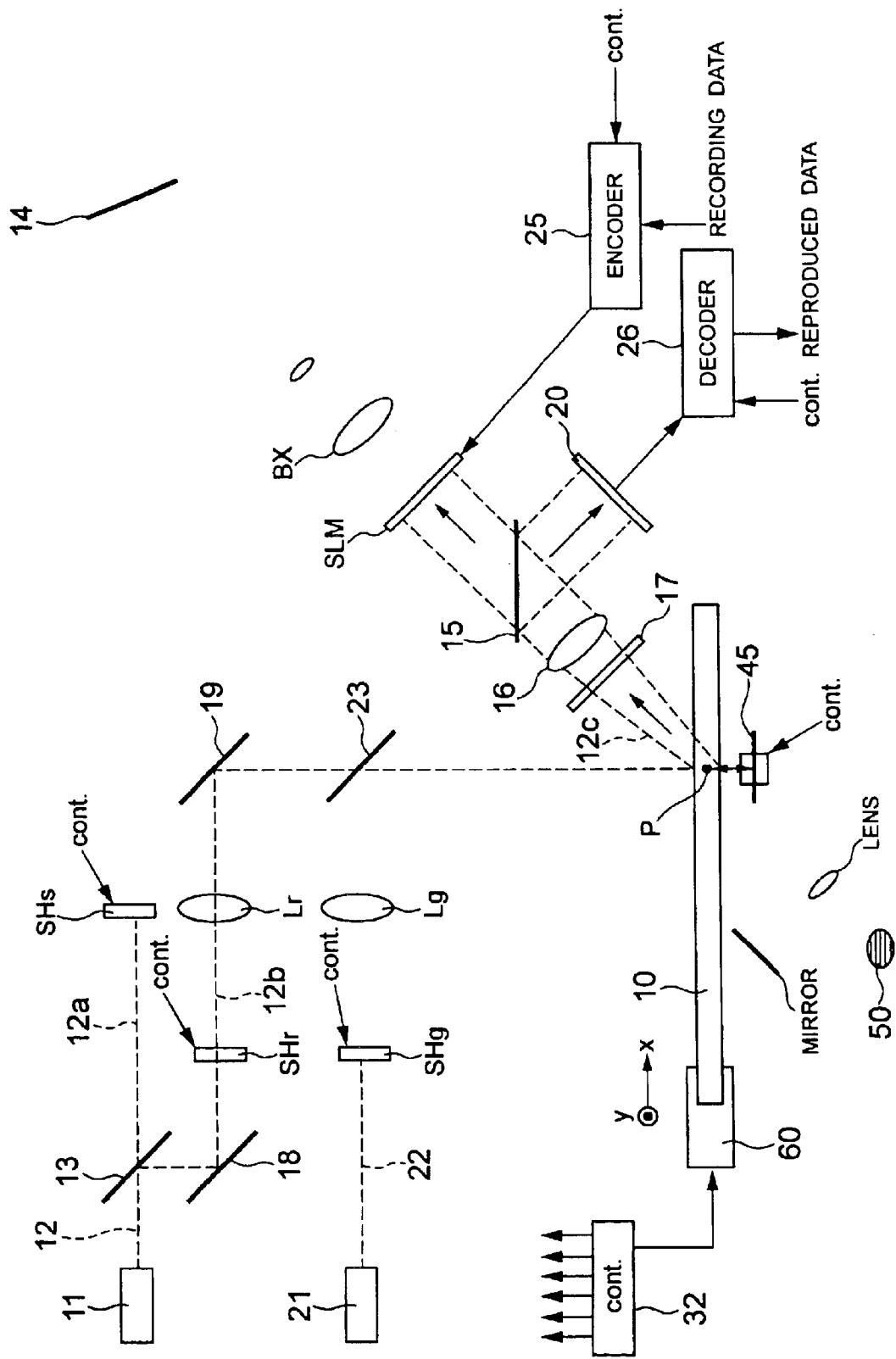
FIG. 7 is a schematic view for explaining a reproducing process in the hologram recording and reproducing apparatus in the present invention.

First, as shown in FIG. 7, the position of the n-axis movable stage 60 holding the recording medium 10 is controlled by the controller 32 so that the recording medium 10 as an object is moved to a predetermined position. Next, only the shutter SHr is opened and the reproduction is started. Next, the reproduction is performed for a predetermined time controlled by the controller 32. Next, the shutter SHr is closed. Thus, the reproduction is completed.

As shown in FIG. 5, the plane mirror 45 is arranged such that a reflecting face of the plane mirror 45 is located in a beam waist of the recording reference light beam 12b and a normal line of this reflecting face is conformed to an incident optical path of the recording reference light beam 12b. In the reproducing step, the recording reference light beam 12b passes through the recording medium 10, and is regularly reflected on the plane mirror 45, and is changed to reproducing reference light beam 12c and is again incident to the recording medium 10. Thus, diffracted light (phase conjugate light as reproduced light) is obtained from the recording medium 10, and the phase conjugate reproduction can be achieved from the recorded refractive index grating. This light becomes a divergent spherical wave from a spherical wave converged in the beam waist via a plane wave. Accordingly, if the plane mirror is arranged in parallel with the wave front of this plane wave in the beam waist position, phase conjugate lights having this convergent spherical wave and the divergent spherical wave similar to each other and advancing directions coaxially opposed to each other are obtained.

In the reproducing time, the normal hologram is also reproduced by the recording reference light beam 12b, but exerts no influence on a reproduction detecting system since the normal hologram is reproduced in an opposite direction not concerned in the reproduction detecting system. Since the plane mirror 45 is arranged so as to be opposed to the recording reference light beam 12b, light obtained by transmitting the recording reference light beam 12b through the recording medium 10 and reflecting the recording reference light beam 12b on the plane mirror 45 is set to reproducing reference light beam 12c. The recording reference light beam 12b and the reproducing reference light beam 12c pass through the same optical path every time. In a reproducing method using the phase conjugate wave, it is necessary to set the recording reference light beam 12b and the reproducing reference light beam 12c to have symmetric properties. Therefore, symmetrical opposed plane waves or spherical waves are used in both the recording reference light beam 12b and the reproducing reference light beam 12c. However, the reproducing reference light beam 12c is coaxial with respect to the recording reference light beam 12b at any time and is propagated in the opposite direction and is incident to the recording medium 10. Thus, diffracted light (phase conjugate wave) is generated from the refractive index grating of a cylindrical shape. The Fourier transformation lens 16 guides this diffracted light to the beam splitter 15, and this dot pattern signal is received by a light receiver of the CCD 20 and is reconverted to an electric digital data signal. Thereafter, when the electric digital data signal is sent to a decoder, original data is reproduced.

Figure 8:
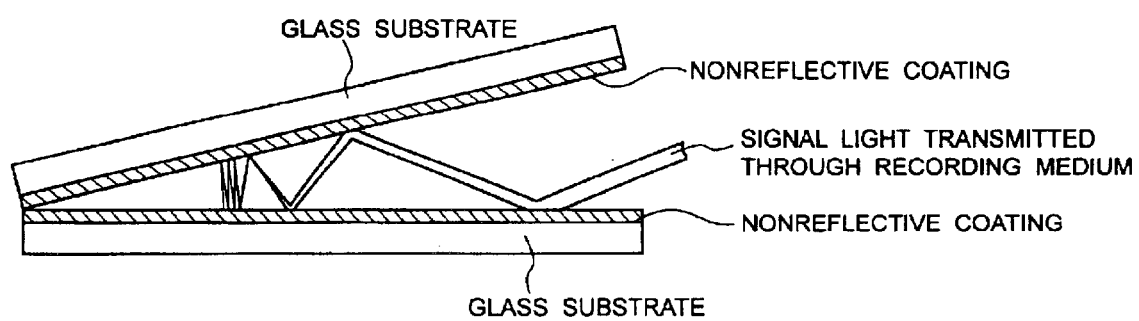
FIG. 8 is a schematic sectional view showing one portion of the hologram recording and reproducing apparatus of another embodiment mode in the present invention.

In the above embodiment, the stray light is prevented by guiding the recording reference light, etc. to the perfect black body 50 by the plane reflecting mirror 45. However, instead of the perfect black body, it is also possible to construct the recording and reproducing apparatus such that light is guided to a portion between opposed mirrors each having a nonreflective coating as shown in FIG. 8.

Further, in another modified example, if a ¼ wavelength plate is arranged between the recording medium 10 and the plane mirror 45, the recording reference light beam 12b passes through the ¼ wavelength plate twice after the recording reference light beam 12b is transmitted through the recording medium 10. Thus, a polarizing direction of the reproducing reference light beam 12c incident to the recording medium 10 can be changed by 90 degrees. Accordingly, a separating optical system for guiding all the signal light to the recording medium 10 and guiding all the diffracted light to a CCD side can be constructed by using a polarizing beam splitter in an optical system for separating the signal light beam 12a from the spatial light modulator SLM and the diffracted light (phase conjugate light as reproducing light) transmitted to the CCD 20. Thus, the light amount can be utilized effectively.

Further, in the above embodiment, the hologram record is used in the transmission type diffraction grating, but equivalent effects can also be fulfilled by using a reflection type diffraction grating. In this case, the recording and reproduction are performed while the plane mirror 45 of FIG. 3 rotated to prevent the stray light at the recording time is fixed.

At the same time, the optical crystal axis of the recording medium is set to be approximately perpendicular to the main surface direction of the plane flat plate. At this time, the diffraction grating is also formed in a bisector angle direction of the recording reference light and the signal light in the reproduction time, and the recording sensitivity becomes maximum when this direction is perpendicular to the optical axis of the recording medium. The recording sensitivity is reduced in a trigonometric function as this direction is shifted from the perpendicular direction. Namely, the recording and reproducing reference lights represent a reverse phenomenon to the above embodiment, and the diffraction grating formed by the reference light and the signal light reflected on the reflecting mirror is close to a direction perpendicular to the optical axis of the recording medium. Therefore, the recording sensitivity is large and the reflection type hologram is formed. However, the diffraction grating (transmission type hologram) composed by the incident reference and signal lights is close to a direction parallel to the optical axis of the recording medium so that the recording sensitivity is very small and this hologram is not easily recorded. At the reproduction time, the incident reference light acts as reproducing reference light for the phase conjugate reproduction, and diffracted light (reproducing conjugate light) from the recording medium is obtained. The normal hologram is similarly reproduced by the reflected light, but has no influence on the phase conjugate reproduction since diffracting directions are different from each other.

In this embodiment, since the two-color hologram is recorded by the gate light reduced in diameter, a recording portion formed in the recording medium is formed in an elongated, needle-like shape so that a spatial multiplex record can be efficiently made.

Similarly, since the density of recording light intensity is improved by reducing the diameter of the reference light in the recording, a high speed recording operation can be also performed in the recording medium of low recording sensitivity and the light source of a low output.

Since the recording light transmitted through the recording medium at the recording time is guided to the light absorber, it is possible to alleviate the inclusion of the stray light as a noise component into a recorded signal.

Since the phase modulating plate is inserted after the modulation of the signal light, the concentration of power onto the vicinity of the zeroth-order light can be alleviated when the interference of the signal light and the reference light is recorded in a hologram. As a result, since the power ratio of a signal component is relatively improved, the signal can be efficiently recorded.

In the above embodiment mode, since a gate light irradiating area in the reproduction time is activated and set to a recording area, the explanation is made with respect to the two-color hologram having no reproduction deterioration and using the gate light constituting a very small sector while the gate light is formed by a converging method similar to that of the recording reference light. However, in the case of a monochromatic hologram in which no gate light is irradiated in the reproduction time, a compact hologram memory system able to perform a high speed recording operation can be also achieved in the recording medium of low recording sensitivity and a low output light source if the very small sector is formed by at least the recording reference light in the above converging method and the phase conjugate reproduction is performed at the reproduction time.

In the present invention, the signal light beam and the recording reference light beam cross each other within the recording medium, and the gate light beam for revealing recording sensitivity of the recording medium is simultaneously irradiated to the recording medium so as to pass through a portion of the recording medium for crossing the signal light beam and the recording reference light beam and demarcate a volume smaller than that of this crossing portion. Accordingly, a recording area is formed in a needle-like elongated shape, and a spatial multiplex record is efficiently made. Further, since the recording reference light is regularly reflected on the plane mirror and is set to reproducing reference light, the light amount can be effectively used and the phase conjugate wave can be utilized by a simple mechanism and a compact memory system can be realized. Thus, in the present invention, the recording and reproducing apparatus can be constructed by a simple lens without requiring a lens of a high performance. This is achieved by utilizing the two-color hologram at the recording time and using the phase conjugate reproducing reference light having a symmetrical property opposed to that of the recording reference light at the reproducing time. Thus, it is very effective to realize a compact recording and reproducing apparatus.

Further, in accordance with the present invention, the recording operation is performed with respect to the very small sector approximately having a cylindrical shape by utilizing the reference light and the gate light in a portion close to a plane wave in the vicinity of a beam waist of the light beam gently converged by a lens having a long focal length. In reproduction, the plane mirror is arranged in the position of the beam waist of the recording reference light and the reproducing reference light is constructed by reflecting and opposing the recording reference light, and the phase conjugate reproduction is performed. Accordingly, even when no large-sized light source is used, a recording time is shortened by increasing light power density by converging the recording light (recording reference light and signal light) to a very small area, and a high speed record and an increase in recording density can be achieved by effectively utilizing recordable capacity of the recording medium by overlapping columnar recording areas. Further, the phase conjugate reproduction for similarly setting wave fronts of the recording and reproducing reference lights can be realized by reflecting the reference light in the beam waist. Accordingly, a recording and reproducing optical system becomes simple so that the memory system can be made compact.

In the present invention, since no multiplex operation is performed in the same sector, no change in refractive index of the recording medium due to the record is added and the difference in wave front between transmission light of the recording medium and incident light is small even when the transmission light of the recording medium is used as reference light. Accordingly, it is advantageous in the signal reproduction. Further, there is no overlapping of influences due to the diffraction grating formation in a reducing direction of the recording sensitivity in the recording medium. Therefore, no large influence is exerted on the reproduction even when there is no light interrupting means of the reflected light.

This application is based on Japanese Patent Applications Nos. 2001-82901 and 2001-109534 which are herein incorporated by reference.

What is claimed is:

1. A hologram recording and reproducing apparatus for forming a plurality of areas of a refractive index grating corresponding to one portion of a three-dimensional light interference pattern of a coherent signal light beam and coherent reference light of a first wavelength modulated in accordance with information data within a recording medium made of a photo refractive crystal of a uniaxial crystal having a parallel flat plate shape, said hologram recording and reproducing apparatus comprising:

a supporting part for detachably holding the recording medium made of the photo refractive crystal having the parallel flat plate shape;

a reference light part for making a coherent recording reference light beam of a first wavelength approximately perpendicularly incident to a main surface of said recording medium;

a signal light part for making the coherent signal light beam of the first wavelength modulated in accordance with the information data of one screen incident to said recording medium, and making the coherent signal light beam cross said recording reference light beam within the recording medium, and generating a light interference pattern of said signal light beam and the recording reference light beam;

a gate light part for making a gate light beam of a second wavelength for revealing recording sensitivity of the recording medium approximately perpendicularly incident to the main surface of said recording medium together with said recording reference light beam, and forming a refractive index grating of one portion of said light interference pattern which passes through a portion of said recording medium for crossing said signal light beam and the recording reference light beam and demarcates a volume smaller than that of this crossing portion;

a phase conjugate wave generating part for generating a phase conjugate wave with respect to said signal light beam by irradiating a reproducing reference light beam coaxial with respect to said recording reference light beam and propagated in an opposite direction to said refractive index grating of said recording medium;

a separating part for separating said phase conjugate wave from an optical path of said signal light beam; and a detecting part for detecting the information data formed as an image by said phase conjugate wave.

2. A hologram recording and reproducing apparatus according to claim 1, wherein the hologram recording and reproducing apparatus further comprises a part for converging said gate light beam and said recording medium is arranged in the vicinity reaching a waist of said gate light beam, and the areas of said refractive index grating are formed in a columnar shape and are adjacently arranged in parallel with each other.

3. A hologram recording and reproducing apparatus according to claim 1, wherein said recording medium has an optical crystal axis approximately parallel or perpendicular to a main surface of the recording medium.

4. A hologram recording and reproducing apparatus according to claim 1, wherein the hologram recording and reproducing apparatus further comprises a part for coaxially irradiating said recording reference light beam and said gate light beam.

5. A hologram recording and reproducing apparatus according to claim 1, wherein the hologram recording and reproducing apparatus further comprises a part for converging said recording reference light beam.

6. A hologram recording and reproducing apparatus according to claim 1, wherein said recording reference light beam and said gate light beam are approximately perpendicularly irradiated to a main surface of said recording medium, and the areas of said refractive index grating of the columnar shape are approximately perpendicularly extended to the main surface of said recording medium.

7. A hologram recording and reproducing apparatus according to claim 1, wherein the gate light beam and the signal light beam are respectively irradiated such that a cross sectional area of said gate light beam on the surface of said recording medium is smaller than that of said signal light beam.

8. A hologram recording and reproducing apparatus according to claim 1, wherein each of the areas of said refractive index grating of the columnar shape is approximately formed in a cylindrical shape.

9. A hologram recording and reproducing apparatus according to claim 1, wherein a maximum inside diameter of the areas of said refractive index grating is smaller than the distance between peaks of zeroth-order and primary diffracted light beams of a light intensity distribution of said signal light beam.

10. A hologram recording and reproducing method for recording and reproducing information using a hologram, comprising:

providing a recording medium made of a photo-refractive crystal of a uniaxial crystal having a shape of parallel flat plates;

converging a coherent recording reference light beam onto said recording medium arranged at an upstream side and in a vicinity of a beam waist of the recording reference light beam passing there through in such manner that said recording reference light beam is irradiated to a main surface of said recording medium;

converging a coherent signal light beam of a first wavelength modulated in accordance with information data onto said recording medium to intersect with the recording reference light beam within said recording medium to form a region of the refractive index grating in a columnar shape extended from the main surface of said recording medium, so that a plurality of the regions of the refractive index grating can be adjacently arranged in parallel with each other correspondingly to a portion of a three-dimensional optical interference pattern of the signal light beam and the reference light beam;

converging and passing the recording reference light beam to the main surface of said recording medium; and reflecting the recording reference light beam at the beam waist or its vicinity thereof to generate a reproducing reference light beam coaxial with the recording reference light beam going back to said recording medium to propagate the reproducing reference light beam in an opposite direction into said refractive index grating of said recording medium to generate a phase conjugate wave.

11. A hologram recording and reproducing method according to claim 10, wherein said recording medium has an optical crystal axis approximately parallel or perpendicular to the main surface of the recording medium.

12. A hologram recording and reproducing method according to claim 10, wherein a maximum inside diameter of the areas of said refractive index grating is smaller than the distance between peaks of zeroth-order and primary diffracted lights of a light intensity distribution of said signal light beam.

13. A hologram recording and reproducing apparatus for forming plural areas of a refractive index grating corresponding to one portion of a three-dimensional optical interference pattern of a coherent signal light beam and coherent reference light of a first wavelength modulated in accordance with information data within a recording medium constructed by a photo-refractive crystal of a uniaxial crystal having a parallel flat plate shape, said hologram recording and reproducing apparatus comprising:

a supporting part for detachably holding the recording medium constructed by the photo-refractive crystal having the parallel flat plate shape;

a reference light part for making a coherent recording reference light beam of the first wavelength convergent and approximately perpendicularly incident to a main surface of said recording medium;

a signal light part for making the coherent signal light beam of the first wavelength modulated in accordance with the information data of one screen incident to said recording medium, and making the coherent signal light beam cross said recording reference light beam within the recording medium, and generating a optical interference pattern of said signal light beam and the recording reference light beam;

a gate light part for making a gate light beam of a second wavelength for enhancing a recording sensitivity of the recording medium convergent and approximately perpendicularly incident to the main surface of said recording medium coaxially with respect to said recording reference light beam, and forming the refractive index grating of one portion of said optical interference pattern which passes through a portion of said recording medium for crossing said signal light beam and the recording reference light beam and demarcates a volume smaller than that of this crossing portion;

a phase conjugate wave generating part which includes a plane mirror arranged in the vicinity of a beam waist of said recording reference light approximately perpendicularly incident to the main surface of said recording medium, and generates a phase conjugate wave with respect to said signal light beam by irradiating a reproducing reference light beam coaxial with respect to said recording reference light beam and propagated in an opposite direction to said refractive index grating of said recording medium by said plane mirror, a separating part for separating said phase conjugate wave from an optical path of said signal light beam; and a detecting part for detecting the information data formed as an image by said phase conjugate wave.

14. A hologram recording and reproducing apparatus according to claim 13, wherein said supporting part has a moving mechanism for moving said recording medium such that the areas of said refractive index grating are formed in a columnar shape and are adjacently arranged in parallel with each other.

15. A hologram recording and reproducing apparatus according to claim 13, wherein said recording medium has an optical crystal axis approximately parallel or perpendicular to the main surface of the recording medium.

16. A hologram recording and reproducing apparatus according to claim 13, wherein the gate light beam and the signal light beam are respectively irradiated such that a cross sectional area of said gate light beam on the surface of said recording medium is smaller than that of said signal light beam.

17. A hologram recording and reproducing apparatus for forming a plurality of refractive index grating areas within a recording medium, said apparatus comprising:

a gate light part for making a gate light beam of a second wavelength for revealing recording sensitivity of the recording medium approximately perpendicularly incident to the main surface of said recording medium together with a recording reference light beam, and forming a refractive index grating of one portion of a light interference pattern which passes through a portion of said recording medium for crossing a signal light beam and a recording reference light beam and demarcates a volume smaller than that of a crossing portion of said signal light beam and said recording reference light beam.

18. The hologram recording and reproducing apparatus according to claim 17, wherein said gate light beam and said reference light beam are approximately coaxial.

19. The hologram recording and reproducing apparatus according to claim 17, wherein said signal light beam is incident to said recording medium at an acute angle with respect to said reference light beam.

\* \* \* \* \*